United States Patent [19]

Muroyama et al.

[11] Patent Number: 5,264,074
[45] Date of Patent: Nov. 23, 1993

[54] FLATTENING METHOD FOR INTERLAYER INSULATING FILM

[75] Inventors: Masakazu Muroyama; Yasushi Morita, both of Kanagawa, Japan

[73] Assignee: Sony Corporation, Tokyo, Japan

[21] Appl. No.: 883,778

[22] Filed: May 15, 1992

[30] Foreign Application Priority Data

May 17, 1991 [JP] Japan .................. 3-142584

[51] Int. Cl.⁵ .................. B44C 1/22; H01L 21/467
[52] U.S. Cl. .................. 156/632; 437/228
[58] Field of Search .................. 156/632; 437/228

[56] References Cited

U.S. PATENT DOCUMENTS

| | | | |
|---|---|---|---|
| 4,971,948 | 11/1990 | Dam et al. | 156/632 |
| 5,077,238 | 12/1991 | Fujii et al. | 437/228 |

FOREIGN PATENT DOCUMENTS

| | | | |
|---|---|---|---|
| 2010448 | 9/1970 | Fed. Rep. of Germany | 437/228 |
| 0254746 | 10/1988 | Japan | 437/228 |

*Primary Examiner*—Carl F. Dees
*Attorney, Agent, or Firm*—Hill, Steadman & Simpson

[57] ABSTRACT

Disclosed herein is a flattening method for an interlayer insulating film in a semiconductor device. A substance for forming a solid flattening film is prepared in a liquid-phase state, and a film (e.g., water film) of the substance in the liquid-phase state having a substantially flat upper surface is formed on an uneven upper surface of the interlayer insulating film. Subsequently, the liquid film thus formed is solidified to be formed into the solid flattening film. Then, the solid flattening film and a part of the interlayer insulating film are etched back to obtain a flat upper surface of the interlayer insulating film. Accordingly, the upper surface of the interlayer insulating film can be flattened at low temperatures.

6 Claims, 1 Drawing Sheet

FLATTENING METHOD FOR INTERLAYER INSULATING FILM

BACKGROUND OF THE INVENTION

The present invention relates to a method of flattening an upper surface of an interlayer insulating film in a semiconductor device.

The demand of multilayer wiring is increasing with the progress of high-density construction of devices. In forming the multilayer wiring with a high density, it is important to flat form a surface of an interlayer insulating film on which the wiring is formed.

Various methods have been proposed to flatten an upper surface of an interlayer insulating film. Particularly in flattening the upper surface by forming the interlayer insulating film on a surface on which a plurality of projections each having a high aspect ratio due to the wiring are formed at intervals of about 100 μm or more, for example, the interlayer insulating film is first formed by chemical vapor deposition or the like with a thickness larger than the height of the projections on the surface on which the projections are formed. Subsequently, a low-melting point compound (e.g., boron oxide ($B_2O_3$)) is formed on the upper surface of the interlayer insulating film. Then, the low-melting point compound thus formed is melted by reflowing at a temperature of about 450° C., for example, and is thereafter cooled to be solidified, thereby forming a flattening film of the low-melting point compound. Then, the flattening film and a part of the interlayer insulating film are etched back to thereby flatten the upper surface of the interlayer insulating film.

However, in forming the interlayer insulating film by the above method, it is necessary to carry out the reflowing of the low-melting point compound such as boron oxide by heating the same at the temperature of about 450° C. Accordingly, in flattening the interlayer insulating film formed on an aluminum alloy wiring containing silicon, the wiring is also heated at the temperature of about 450° C., so that the silicon contained in the wiring is deposited to increase a contact resistance. As a result, a reliability of the wiring is reduced. Further, it is difficult to form the flattening film having a completely flat upper surface by the reflowing.

SUMMARY OF THE INVENTION

It is an object of the present invention to provide a flattening method for an interlayer insulating film which can flatten the upper surface of the interlayer insulating film at low temperatures.

According to the present invention, a substance for forming a flattening film is prepared in a liquid-phase state, and a film of the substance in the liquid-phase state having a flat upper surface is formed on an uneven upper surface of an interlayer insulating film. Then, the liquid film thus formed is solidified to be formed into the flattening film. Subsequently, the flattening film and a part of the interlayer insulating film are etched back to flatten the upper surface of the interlayer insulating film.

In the flattening method mentioned above, the film of the substance in the liquid-phase state having a flat upper surface is formed on the upper surface of the interlayer insulating film, and the film thus formed is then solidified to be formed into the flattening film. Therefore, the flattening film can be formed from a substance capable of being solidified at low temperatures such as water. As a result, the flattening of the interlayer insulating film can be carried out at low temperatures, thereby preventing a reduction in the reliability of the wiring.

As described above, the flattening film is formed on the upper surface of the interlayer insulating film by utilizing a solidification phenomenon. That is, the flattening film can be formed from a substance capable of being solidified at low temperatures such as water. Thus, the flattening film can be formed on the upper surface of the interlayer insulating film at low temperatures without heating the wiring formed under the upper surface of the interlayer insulating film to high temperatures. As a result, the reliability of the wiring can be improved.

Other objects and features of the invention will be more fully understood from the following detailed description and appended claims when taken with the accompanying drawings.

BRIEF DESCRIPTION OF THE DRAWING

The single FIGURE is a flow diagram illustrating a flattening method for an interlayer insulating film according to a preferred embodiment of the present invention.

DETAILED DESCRIPTION OF THE PREFERRED EMBODIMENT

Figure 1:
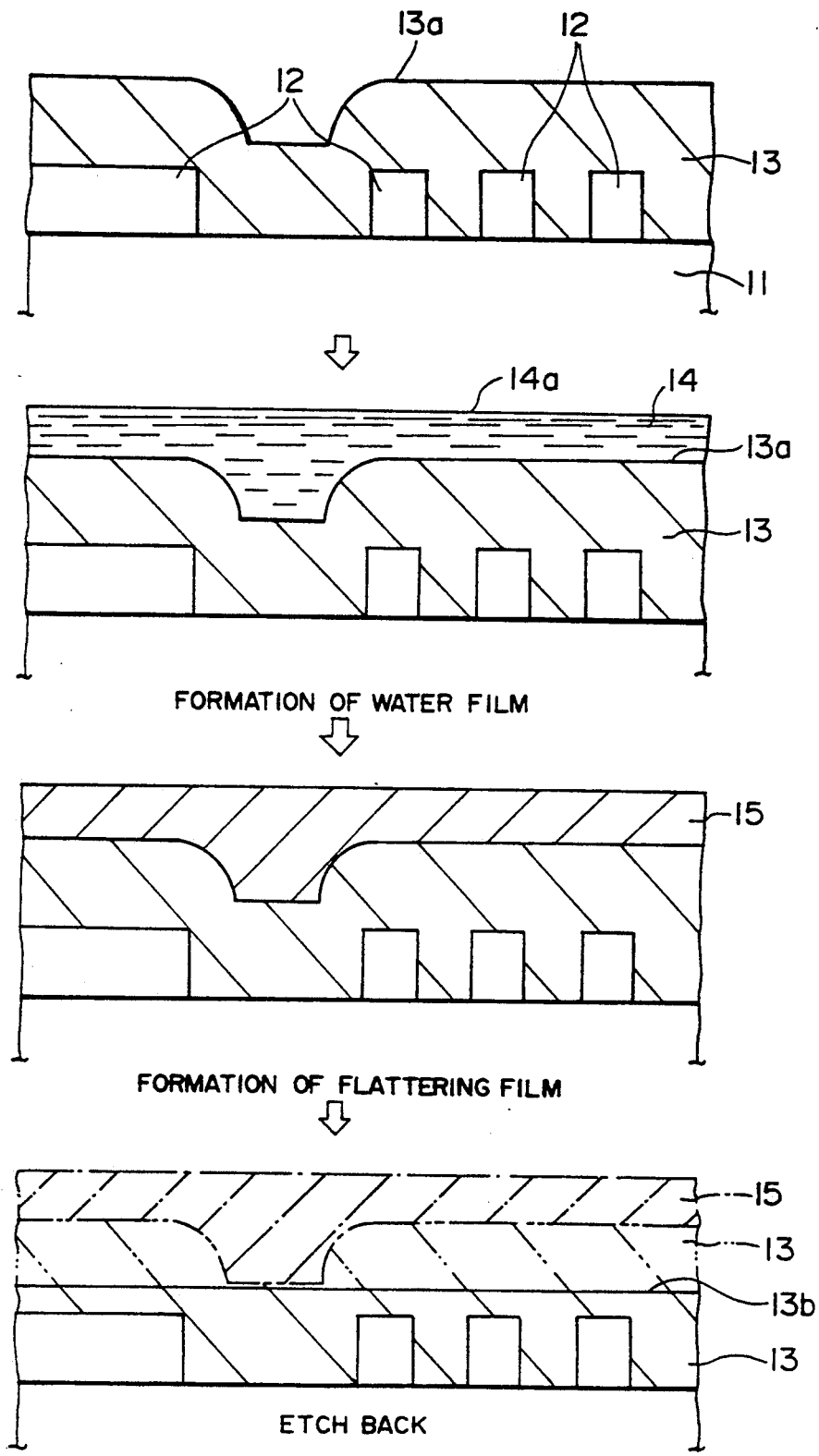

A preferred embodiment of the present invention will now be described with reference to the accompanying drawing.

In this preferred illustrated embodiment, water is employed as the substance for forming the flattening film according to the present invention.

Referring to the drawing, a plurality of wirings (e.g., aluminum—1% silicon alloy wirings) 12 are formed on a substrate 11.

First, an interlayer insulating film (e.g., silicon oxide film) 13 is formed on a surface of the substrate 11 where the wirings 12 are formed, by chemical vapor deposition as an ordinary method. In this condition, an upper surface 13a of the interlayer insulating film 13 is made uneven by each wiring 12.

As a first step of the flattening method, formation of a flattening film 15 is carried out. First in this step, a water film 14 in a liquid-phase state is formed on the upper surface 13a of the interlayer insulating film 13 until a thickness of the water film 14 becomes larger than a height of the unevenness of the upper surface 13a, under the condition where an atmosphere on the side of the upper surface 13a of the interlayer insulating film 13 is a coexisting condition of a liquid phase and a solid phase of water (e.g., at a temperature of 0° C. under a pressure of 13.3 kPa). The formation of the water film 14 is effected by spraying steam ($H_2O$) onto the upper surface 13a of the interlayer insulating film 13 and condensing the steam on the interlayer insulating film 13, for example. An upper surface 14a of the water film 14 formed by the condensation becomes substantially flat by a surface tension of water. Further, as the water film 14 is formed by spraying steam onto the upper surface 13a of the interlayer insulating film 13 and condensing the steam, a thickness of the water film 14 to be formed becomes small such as about 2 μm.

Subsequently, the water film 14 is cooled to a solidifying temperature (e.g., −2° C.) of the water film 14, so that the water film 14 is solidified to be formed into an ice film as the flattening film 15.

In the case that water is employed as the substance for forming the flattening film 15, the atmosphere may be a supercooling condition. For example, the atmosphere on the interlayer insulating film 13 side may be suitably set at temperatures ranging from −15° C. to 2° C. under pressures ranging from 610 to 101 kPa.

As a second step of the flattening method, etch back is carried out. In this step, the flattening film 15 and the interlayer insulating film 13 are etched back at the same etching rate by ordinary sputter etching. That is, the flattening film 15 (shown by a one-dot chain line) is entirely etched off and a part (shown by a two-dot chain line) of the interlayer insulating film 13 is also etched off to form a flat upper surface 13b of the interlayer insulating film 13. The conditions of the etch back are set so as to make the etching rate of the flattening film 15 equal to that of the interlayer insulating film 13. For example, argon (Ar) is employed as an etching gas; a flow rate of the etching gas is set to 50 sccm; a pressure of an etching atmosphere is set to 40 Pa; a temperature of a susceptor for placing the substrate 11 thereon is set to −2° C.; and a high-frequency power to be applied between electrodes of a sputter etching apparatus (not shown) is set to 50 W.

In the event that a thickness of the interlayer insulating film 13 formed by the above etch back becomes smaller than a predetermined thickness, another interlayer insulating film (not shown) is formed on the upper surface 13b of the interlayer insulating film 13 by chemical vapor deposition, for example, thereby obtaining the predetermined thickness of the interlayer insulating film 13.

In the above preferred embodiment, the flattening film 15 is formed by solidifying water. Therefore, the wirings 12 (e.g., aluminum or aluminum alloy wirings) covered with the interlayer insulating film 13 are not heated to temperatures (e.g., 300° C. or higher) which would reduce the reliability of the wirings 12. As a result, the reliability of the wirings 12 is not reduced.

Further, since the water film 14 is formed in the coexisting condition of the liquid phase and the solid phase of water, volume expansion occurring in the formation of the ice film by freezing the water film 14 can be minimized. Accordingly, there is no possibility of cracks in the ice film formed by freezing the water film 14.

Further, even when water is deposited on the substrate 11 or the interlayer insulating film 13 after the etch back, the water can be completely removed by heating the substrate 11 or the interlayer insulating film 13 to temperatures (e.g., 130° C.) which will not damage the reliability of the wirings 12. Accordingly, there is no adverse effect on a subsequent step after flattening the interlayer insulating film 13, e.g., a step of forming an aluminum alloy film on the upper surface 13b of the interlayer insulating film 13 by sputtering or the like.

Although water is employed as the substance for forming the flattening film 15 in the above preferred embodiment, any other substances having a melting point of between −30° C. to 30° C. and a boiling point of 200° C. or lower may be employed. Examples of such substances may include ethylene diamine ($H_2NCH_2CH_2NH_2$; m.p. 8.5° C., b.p. 117.0° C.), formic acid (HCOOH; m.p. 8.4° C., b.p. 100.8° C.), β-aminoethyl alcohol ($H_2NCH_2CH_2OH$; m.p. 10.5° C., b.p. 171.1° C.), and ethylene glycol ($HOCH_2CH_2OH$; m.p. −12.6° C., b.p. 197.85° C.).

Also in the case of employing the above substances, the flattening film 15 is formed by the same method as that mentioned in the above preferred embodiment. In this case, the atmosphere (e.g., temperature, pressure, etc.) for forming the flattening film 15 is suitably decided according to the above substances.

Further, the above substances have a compatibility with at least one of water, ethyl alcohol, and ether. Therefore, even when the the above substances are deposited on the substrate 11 or the interlayer insulating film 13 after the etch back, they can be easily removed by ordinary washing, so that there is no possibility that the above substances remain as an impurity on the substrate 11 or the interlayer insulating film 13.

While the invention has been described with reference to a specific embodiment, the description is illustrative and is not to be construed as limiting the scope of the invention. Various modifications and changes may occur to those skilled in the art without departing from the spirit and scope of the invention as defined by the appended claims.

What is claimed is:

1. A flattening method for an interlayer insulating film comprising:
   a first step of forming a flattening ice film on an uneven upper surface of said interlayer insulating film; and
   a second step of etching to remove said flattening ice film and a part of said interlayer insulating film to flatten said upper surface of said interlayer insulating film; the improvements comprising
   said first step comprises forming a water film having a substantially flat upper surface on said uneven upper surface of said interlayer insulating film, and then freezing said water film to form said flattening ice film.

2. The flattening method as defined in claim 1, wherein said water film is formed in an atmosphere that a liquid phase and a solid phase of said water coexist.

3. The flattening method as defined in claim 1, wherein said water film is formed by spraying steam onto said upper surface of said interlayer insulating film and condensing said steam.

4. The flattening method as defined in claim 2, wherein said atmosphere is set at temperatures ranging from −15° C. to 2° C. under pressures ranging from 610 Pa to 101 kPa.

5. A flattening method for an interlayer insulating film comprising:
   a first step of forming a solid flattening film on an uneven upper surface of said interlayer insulating film; and
   a second step of etching to remove said solid flattening film and a part of said interlayer insulating film to flatten said upper surface of said interlayer insulating film; the improvements comprising
   said first step comprising selecting a substance for forming said flattening film from substances having a melting point in a range of −30° C. to 30° C. and a boiling point ≦200° C., forming a liquid film of said substance having a substantially flat upper surface on said uneven upper surface of said interlayer insulating film, and then solidifying said liquid film of said substance to form said solid flattening film.

6. The flattening method as defined in claim 5, wherein said substances include water, ethylene diamine, formic acid, β-aminoethyl alcohol, and ethylene glycol.

* * * * *